(12) United States Patent
Hsiao et al.

(10) Patent No.: US 7,666,000 B1
(45) Date of Patent: Feb. 23, 2010

(54) BURN-IN SOCKET WITH HYBRID TERMINAL ASSEMBLY

(75) Inventors: Shih-Wei Hsiao, Tu-cheng (TW); Hsiu-Yuan Hsu, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/384,636

(22) Filed: Apr. 7, 2009

(30) Foreign Application Priority Data

Apr. 7, 2009 (TW) .............................. 97205822 U

(51) Int. Cl.
*H01R 12/00* (2006.01)
(52) U.S. Cl. .......................................... 439/66; 439/83
(58) Field of Classification Search .................. 439/66, 439/83, 700, 295
See application file for complete search history.

(56) References Cited

U.S. PATENT DOCUMENTS 6,776,668 B1 * 8/2004 Scyoc et al. ................. 439/700
6,958,616 B1 * 10/2005 Mahoney et al. ............ 324/754
7,559,769 B2 * 7/2009 Hsiao et al. .................... 439/66
7,559,771 B2 * 7/2009 Akama et al. ................. 439/66

FOREIGN PATENT DOCUMENTS

CN 2563774 Y 7/2003
CN 200947487 Y 9/2007

* cited by examiner

*Primary Examiner*—Khiem Nguyen
(74) *Attorney, Agent, or Firm*—Andrew C. Cheng; Wei Te Chung; Ming Chieh Chang

(57) ABSTRACT

A burn-in socket includes an insulative housing and a number of electrical terminal assemblies secured to the insulative housing. The terminal assembly includes a first contact and a second contact contacting with each other. The first and second contact each is provided with a mating end projecting beyond the insulative housing. The second contact includes a stem portion sliding along a slot in the connecting end of the first contact and a coiled spring. The coiled spring is connected with and surrounding the stem portion.

8 Claims, 5 Drawing Sheets

US 7,666,000 B1

BURN-IN SOCKET WITH HYBRID TERMINAL ASSEMBLY

1. FIELD OF THE INVENTION

The present invention relates to A burn-in socket, and more popularly to A burn-in socket with improved terminal assembly for making connections between integrated circuit (IC) package and circuit boards.

2. DESCRIPTION OF THE PRIOR ART

Chinese patent No. CN 2563774Y issued to Lin et al. on Jul. 30, 2003 discloses an electrical contact for electrically connecting with two devices. The electrical contact includes a sleeve, two contact members disposed within the sleeve and a spring arranged between the two contacts and also received in the sleeve. The sleeve is provided with a plunger and a barrel mating with each other and each of the plunger and barrel defines a cavity. The two contact members each have a contact tip extending through the cavity and projecting out of the plunger and the barrel, respectively. The contact tips of two contact members mate with spring so as to be extensible in the sleeve.

FIG. 5 shows another type of conventional electrical contact 1' used in similar condition and including a hollow sleeve 13', a top pin 14', a bottom pin 12' disposed in the sleeve, and a spring member 132' arranged between the two contacts and also received in the sleeve. The top and bottom pin 14', 12' project out of top and bottom end of the sleeve and each has a retaining portion 141', 124' to keep the contacts in the sleeve. The metal sleeve 13' opens at the top and bottom end thereof. In assembly, the spring 132', top and bottom pin 14', 12' are attached into the sleeve 13' in turn. Then, the opposite ends of the sleeve is staked thereby positioning the two pins and spring therein. However, the sleeve mentioned above has barrel-like configuration whereby complicates the manufacture process. Furthermore, the sleeve is easily distorted during staking.

Therefore, there is need to supply an improved electrical contact.

SUMMARY OF THE INVENTION

Accordingly, an object of the present invention is to provide an electrical terminal which can be readily assembled into a burn-in socket.

In order to achieve the object set forth, A burn-in socket comprises an insulative housing and a plurality of electrical terminal assemblies attached to the insulative housing. Each terminal assembly comprises a first contact and a second contact contacting with each other. The first contact includes end projecting beyond the insulative housing at a top end thereof and a connecting end with a slot. The second contact comprises a stem portion sliding along the slot of the first contact and a coiled spring connected with the stem portion. The coiled spring is surrounding the stem portion and has a connecting end mating with the connecting end of the first contact and a mating end projecting beyond the insulative housing at a bottom end thereof.

DESCRIPTION OF PREFERRED EMBODIMENT

Reference will now be made to the drawings to describe the present invention in detail.

Figure 1:
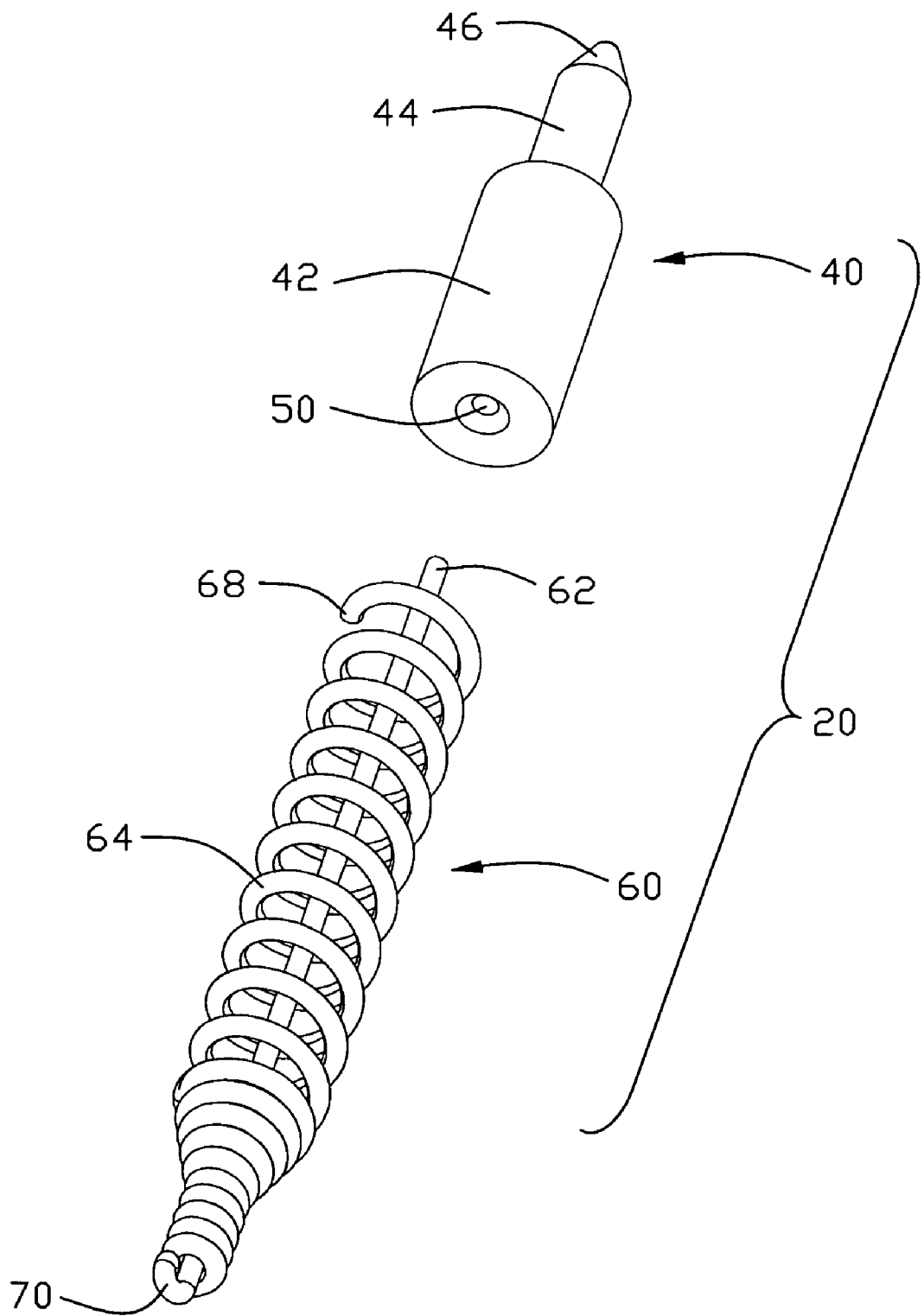
FIG. 1 is an exploded perspective view of an electrical terminal assembly according to a preferred embodiment of the present invention.
Figure 2:
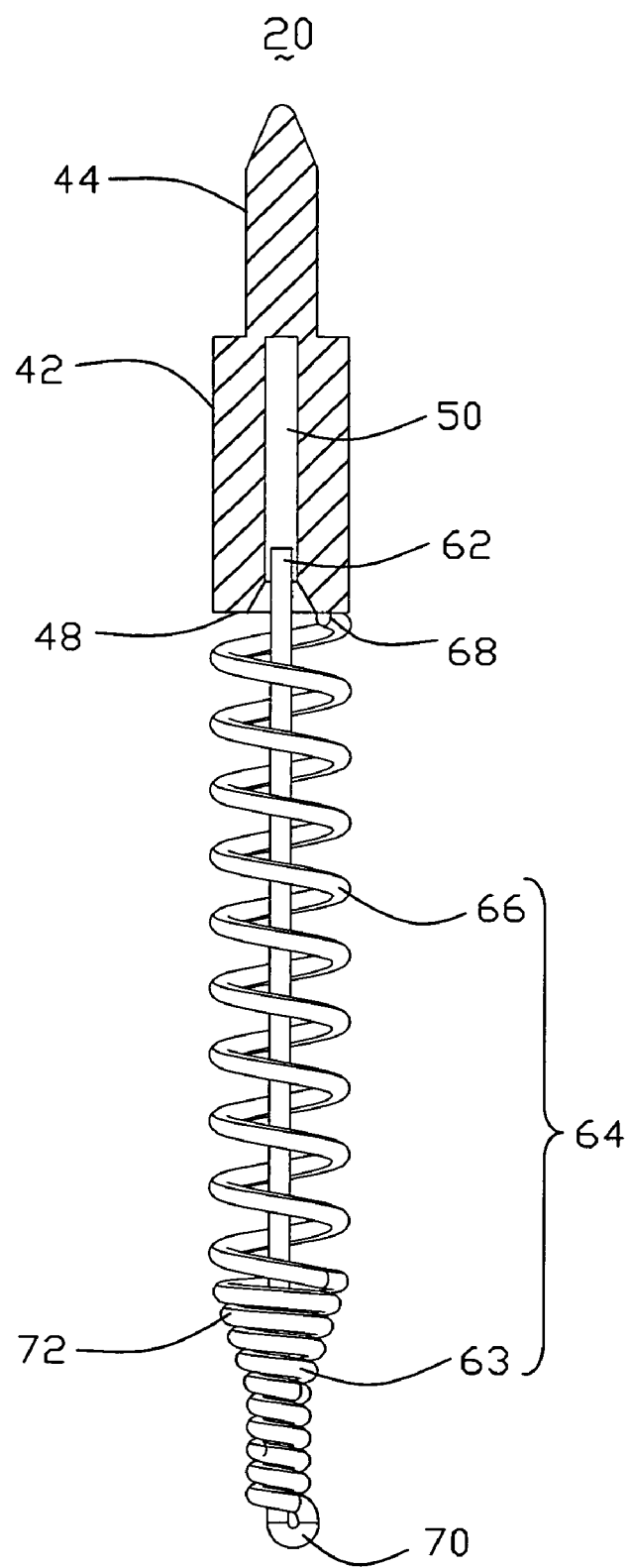
FIG. 2 is a cross-sectional view of the electrical terminal assembly shown in FIG. 1.
Figure 3:
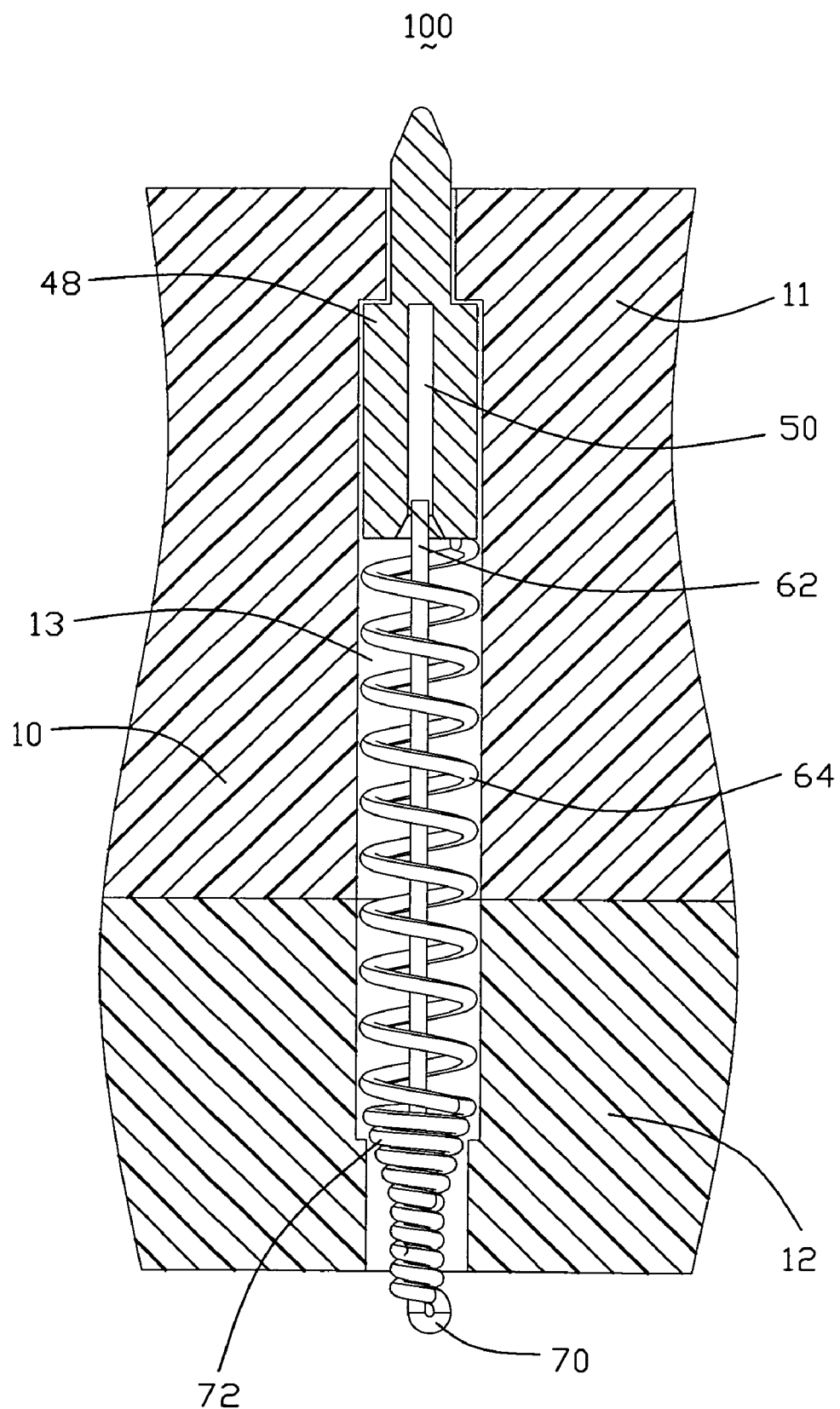
FIG. 3 is a partial cross-section view of the burn-in socket of the present invention.
Figure 4:
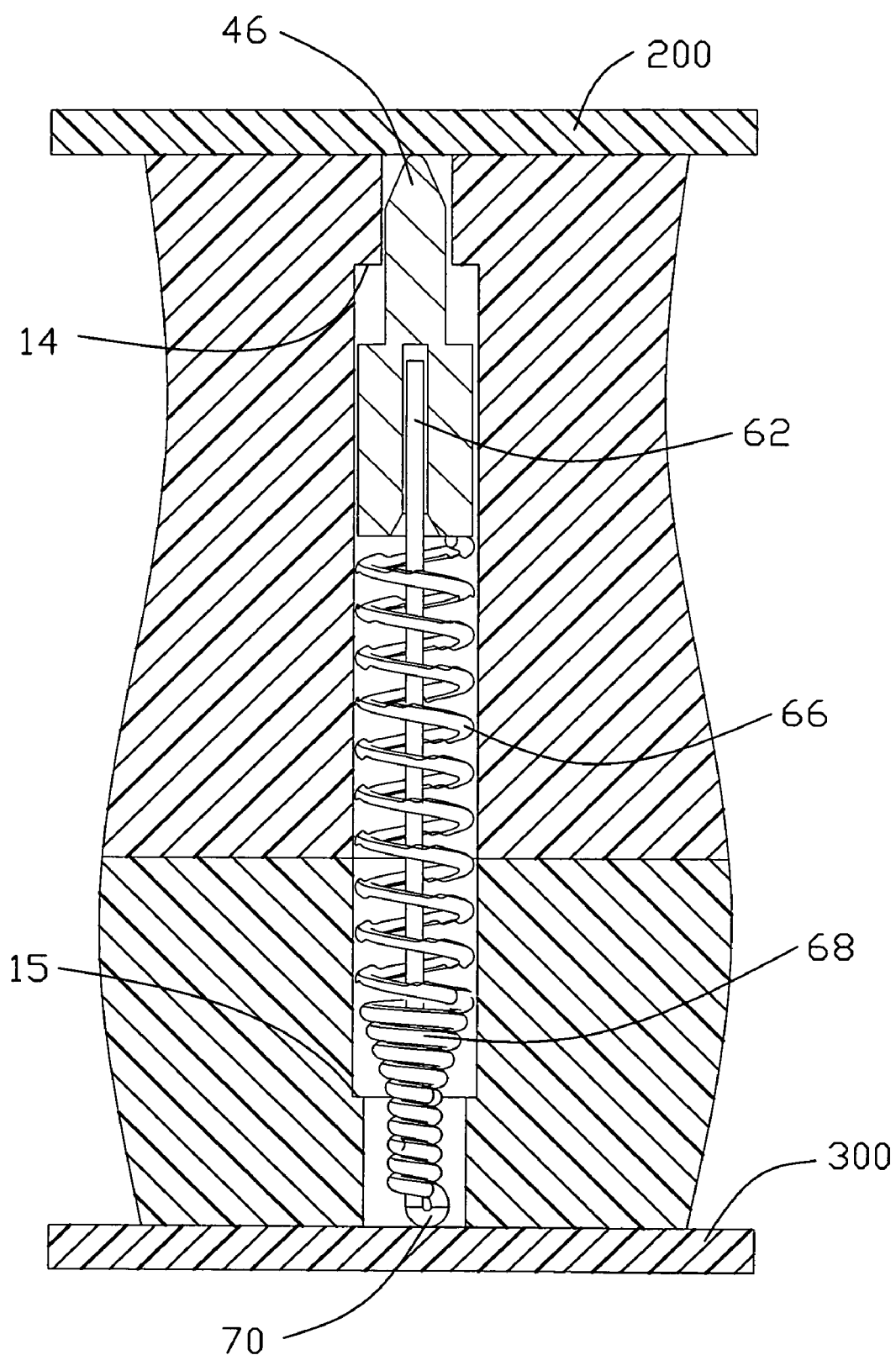
FIG. 4 is similar to FIG. 3, showing the electrical terminal assembly being pressed by an IC package and a circuit board.
Figure 5:
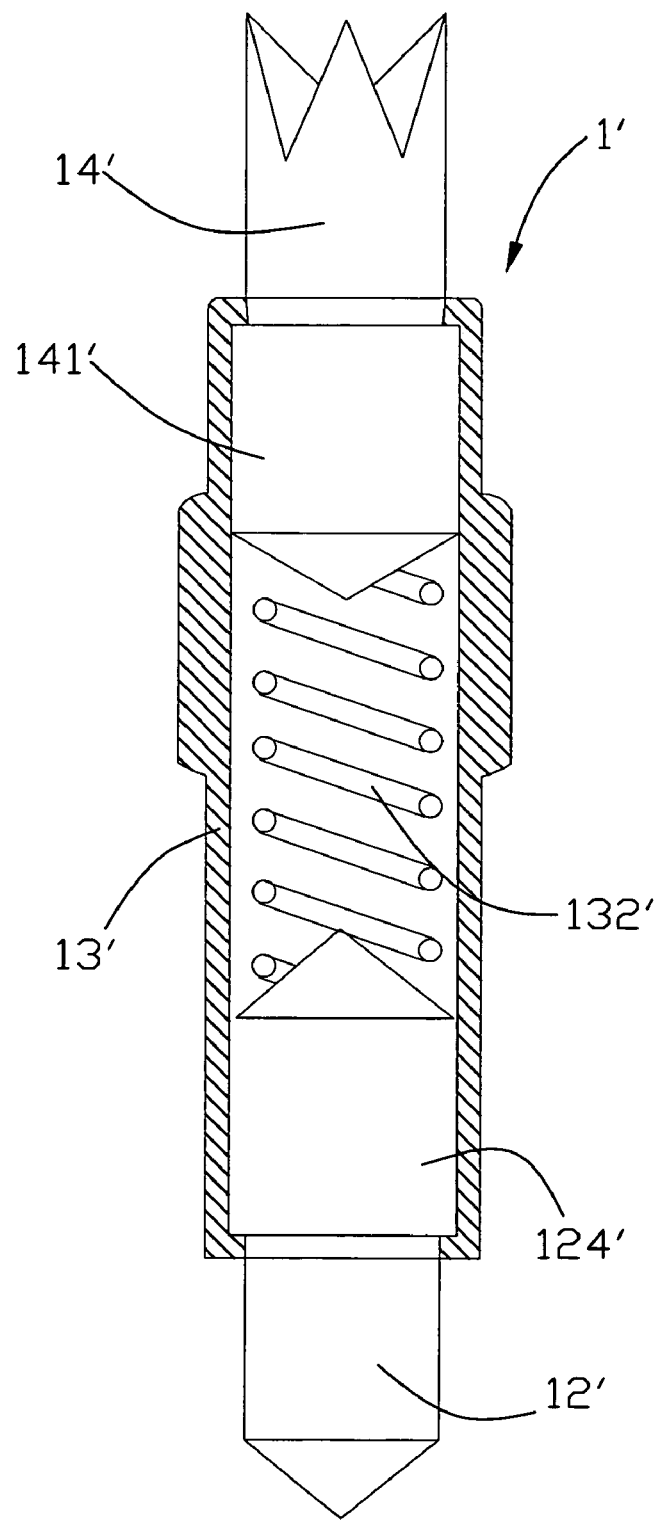
FIG. 5 is a conventional electrical terminal assembly.

Please referring to FIGS. 1-3, A burn-in socket 100 in accordance with the present invention for connecting an integrated circuit (IC) package 200 with a circuit board 300 includes an insulative housing 10 and a plurality of metal terminal assemblies 20 attached to the insulative housing 10. The insulative housing 10 comprises a top plate 11 and a bottom plate 12 which jointly define a plurality of passageways 13 for receiving the electrical terminal assemblies 20, respectively. The passageways 13 has top and bottom stop surface 14, 15 at top and bottom ends thereof.

Each of the metal terminal assemblies 20 includes a first contact 40 and a second contact 60 contacting with each other. The first contact 40 is configured to a column and has a shoulder dividing the first contact 40 into two parts. The part located at an upper end of the first contact 40 is a mating end 44 and the other is a connecting end 42 with the diameter of the connecting end 42 exceeding the mating end 44. The mating end 44 can project beyond the top plate 11 and has a contact point 46 for contacting with the IC package 200. A slot 50 is provided in the connecting end 42 and opens at a bottom face 48 on which the first and second contact 40, 60 are mechanically and electrical connected with each other. The first contact 40 can be shaped by lathe.

The second contact 60 includes a linear stem portion 62 sliding freely within the slot 13 of the first contact 40 and a coiled spring 64 surrounding the stem portion 62. The coiled spring 62 comprises a compressible uniform section 66, an uncompressible decrescent section 64 and a stop section 72 formed therebetween. The uniform section 66 forms a connecting end 68 contacting with the connecting end 42 of the first contact 40 and a mating end 70 which can project beyond the bottom plate 12 for mating with the circuit board 300. The coiled spring 66 is provided a connecting end 68 at a top end thereof and a mating end 70 at a bottom end thereof. The coiled spring 64 and stem portion 62 are formed a one-piece, integral unit and joint adjacent to the mating end 70 of the second contact 60. The stem portion 62 is straight and unconstrained all along.

In assembly, the first and second contact 40, 60 are received in the passageways 13 of the insulative housing 10. The shoulder section 48 of the first contact 40 and the stop section 72 of the second contact 60 are restricted by the top and bottom stop surface 14, 15, respectively whereby positions the first and second contact 40, 60 on the insulative housing 10. The uniform section 66 of the coiled spring has a spring diameter substantially equal to the diameter of the connector end 42 of the first contact 40.

The connecting ends 48, 68 of the first and second contacts contacting with each other and the mating ends 44, 70 extending out of the insulative housing 10. Therefore, the electrical terminal assembly 20 is press-fit between the IC package 200 and the circuit board 300. During operation, the coiled spring is compressed to deform and the term is nondeformable during sliding in the slot 50 of the first contact 40.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A burn-in socket comprising:
   an insulative housing; and
   a plurality of electrical terminal assemblies attached to the insulative housing and each comprising a first contact and a second contact contacting with the first contact, said first contact having a mating end projecting beyond the insulative housing at a top end thereof and a connecting end with a slot, said second contact comprising a stem portion sliding along the slot of the first contact and a coiled spring connected with the stem portion, said coiled spring surrounding the stem portion and having a connecting end mating with the connecting end of the first contact and a mating end projecting beyond the insulative housing at a bottom end thereof.

2. The burn-in socket as claimed in claim 1, wherein the insulative housing comprises a top plate and a bottom plate which together define a plurality of passageways for receiving the electrical terminal assemblies, respectively.

3. The burn-in socket as claimed in claim 2, wherein the passageways has top and bottom stop surface at opposite sides thereof for positioned the first and second contact on the insulative housing.

4. The burn-in socket as claimed in claim 3, wherein the first contact is configured to a post and the diameter of the connecting end exceeds that of the mating end, and connecting end and the mating end form a shoulder therebetween for engaging with the top stop surface of the insulative housing.

5. The burn-in socket as claimed in claim 3, wherein the coiled spring comprises a uniform section and a decrescent section which form a stop section therebetween engaging with the bottom stop surface of the isulative housing.

6. The burn-in socket as claimed in claim 5, wherein the connecting end and the mating end of the second contact are formed on the uniform section and decrescent section, respectively.

7. The burn-in socket as claimed in claim 6, wherein the diameter of the uniform section of the coiled spring is substantially equal to the diameter of the connector end of the first contact.

8. The burn-in socket as claimed in claim 1, wherein the stem portion is straight and unconstrained when sliding in the slot of the first contact.

* * * * *